(12) United States Patent
Troia et al.

(10) Patent No.: US 12,254,938 B2
(45) Date of Patent: Mar. 18, 2025

(54) MEMORY DEVICE WITH SERIAL AND PARALLEL TESTING STRUCTURE FOR SENSING AMPLIFIERS

(71) Applicant: Lodestar Licensing Group LLC, Evanston, IL (US)

(72) Inventors: ALberto Troia, Munich (DE); Antonino Mondello, Messina (IT)

( * ) Notice: Subject to any disclaimer, the term of this patent is extended or adjusted under 35 U.S.C. 154(b) by 134 days.

(21) Appl. No.: 17/844,557

(22) Filed: Jun. 20, 2022

(65) Prior Publication Data

US 2023/0410930 A1    Dec. 21, 2023

Related U.S. Application Data

(63) Continuation of application No. 16/625,105, filed as application No. PCT/IB2019/000475 on May 31, 2019, now Pat. No. 11,367,497.

(51) Int. Cl.
| | | |
|---|---|---|
| *G11C 29/32* | (2006.01) | |
| *G11C 29/02* | (2006.01) | |
| *G11C 29/06* | (2006.01) | |
| *G11C 29/12* | (2006.01) | |
| *G11C 29/42* | (2006.01) | |

(52) U.S. Cl.
CPC .............. *G11C 29/32* (2013.01); *G11C 29/02* (2013.01); *G11C 29/06* (2013.01); *G11C 29/1201* (2013.01); *G11C 29/42* (2013.01); *G11C 2029/3202* (2013.01)

(58) Field of Classification Search
CPC ......... G11C 29/32; G11C 29/02; G11C 29/06; G11C 29/1201; G11C 29/42; G11C 2029/3202; G11C 2029/0411; G11C 29/48

See application file for complete search history.

(56) References Cited

U.S. PATENT DOCUMENTS

| | | | |
|---|---|---|---|
| 5,341,382 A | 8/1994 | Levitt | |
| 6,102,963 A * | 8/2000 | Agrawal | H03K 19/17704 716/117 |
| 2001/0048625 A1* | 12/2001 | Patti | G11C 29/76 365/201 |
| 2002/0110031 A1* | 8/2002 | Lee | G11C 7/1045 365/201 |

(Continued)

OTHER PUBLICATIONS

International Search Report and Written Opinion from related international application No. PCT/IB2019/000475, dated Sep. 12, 2019, 16 pages.

*Primary Examiner* — Donald HB Braswell
(74) *Attorney, Agent, or Firm* — Brooks, Cameron & Huebsch, PLLC

(57) ABSTRACT

An example memory device with an improved sensing structure including a memory array comprising a plurality of sub-arrays of memory cells and structured in memory blocks, sense amplifiers coupled to the memory cells, and modified JTAG cells coupled in parallel to the outputs of the sense amplifiers and serially interconnected in a scan-chain structure integrating a JTAG structure and the sense amplifiers. In the example memory device, the scan-chain structures associated to each sub array are interconnected to form a unique chain as a boundary scan register. Further, in the example memory device, the boundary scan register is a testing structure to test interconnections of the sense amplifiers.

15 Claims, 10 Drawing Sheets

(56) References Cited

U.S. PATENT DOCUMENTS

| | | |
|---|---|---|
| 2002/0154536 A1 | 10/2002 | Perner |
| 2003/0043664 A1 | 3/2003 | Haraguchi |
| 2003/0163773 A1 | 8/2003 | O'Brien et al. |
| 2005/0093568 A1 | 5/2005 | Ohara |
| 2007/0250744 A1 | 10/2007 | Nguyen et al. |
| 2008/0158978 A1* | 7/2008 | Nishiyama ............ G11C 29/40 |
| | | 365/189.12 |
| 2011/0012643 A1 | 1/2011 | Jain |
| 2011/0090751 A1 | 4/2011 | Manna |
| 2012/0163108 A1* | 6/2012 | Kazuno ................ G11C 29/36 |
| | | 365/201 |
| 2012/0272112 A1 | 10/2012 | Ph |
| 2013/0036254 A1 | 2/2013 | Fai et al. |
| 2013/0036255 A1 | 2/2013 | Fai et al. |
| 2014/0022836 A1 | 1/2014 | Kim |
| 2015/0269991 A1 | 9/2015 | Hsieh et al. |
| 2016/0027485 A1 | 1/2016 | Park |
| 2018/0012636 A1 | 1/2018 | Alzheimer |
| 2019/0004915 A1* | 1/2019 | Chang .................... G11C 29/48 |
| 2020/0227130 A1* | 7/2020 | Kim ....................... G11C 7/222 |

* cited by examiner

MEMORY DEVICE WITH SERIAL AND PARALLEL TESTING STRUCTURE FOR SENSING AMPLIFIERS

PRIORITY INFORMATION

This application is a Continuation of U.S. application Ser. No. 16/625,105, filed on Dec. 20, 2019, which is a National Stage Application under 35 U.S.C § 371 of International Application Number PCT/IB2019/000475, filed May 31, 2019, the contents of which are incorporated herein by reference.

DESCRIPTION

The present invention relates to memory devices and more particularly to a memory device or component allowing to replace an embedded memory portion in SoC devices and structured with an improved sensing circuitry allowing to perform a digital test of the sense amplifiers.

BACKGROUND

A system on a chip or SoC is a semiconductor integrated circuit that integrates all components of a computer or other electronic systems. These components typically include a central processing unit (CPU), memory portions, input/output ports and secondary storage components, all on a single semiconductor substrate.

A SoC device may contain digital, analog, mixed-signal, and often radio frequency signal processing functions, depending on the application. As they are integrated on a single electronic substrate, a SoC device may consume much less power and take up much less area than multi-chip designs with equivalent functionality. SoC devices are nowadays very common in the mobile computing, in embedded systems and in the Internet of Things.

Particularly in the automotive field there is a felt need to dispose of SoC devices including controllers, memories and connections with many external sensors and actuators. Moreover, the controllers of these SoC devices are required to have a long-life term and an extremely high reliability and to work with the memory portions embedded in the SoC device with a low initial latency time and with the maximum throughput possible.

Non-volatile Flash memories are today one of the fundamental building blocks in modern electronic systems, including the SoC devices for automotive applications and specifically for Real Time Operating Systems, i.e. RTOS. Their performance in terms of speed, consumption, alterability, nonvolatility and the increasing importance of system reconfigurability have pushed up to now for flash memory integration in System-on-Chip devices.

However, flash integration introduces many issues both at system and at circuit/technology levels that need a careful design. From the system point of view, several aspects are involved in the choice of the flash memory type to be integrated in the SoC device; the most important ones, depending on the specific applications and requirements, are their yield, cost, power consumption, reliability and performance requirements.

Moreover, embedded memories in SoC devices is difficult to be managed when the lithography node is for instance below 28 nm and when the embedded macro flash can be the biggest portion of the SoC.

DETAILED DESCRIPTION

With reference to those figures, apparatuses and methods involving a non-volatile memory device or component and a host device for such a memory device will be disclosed herein.

According to embodiments of the present disclosure, an independent memory device or component 100 is realized with a technology specifically dedicated to the manufacturing of flash memory devices. This new memory component 100 is associated and linked to a SoC structure 110 partially overlapping such a structure while the corresponding semiconductor area of the SoC structure has been used for other logic circuits and for providing support for the overlapping structurally independent memory portion.

It is herein disclosed a non-volatile memory structure 100 that can improve the access time. In any case, the System-on-Chip 110 and the associated memory device are realized on a respective die obtained by a different lithography process.

Figure 1:
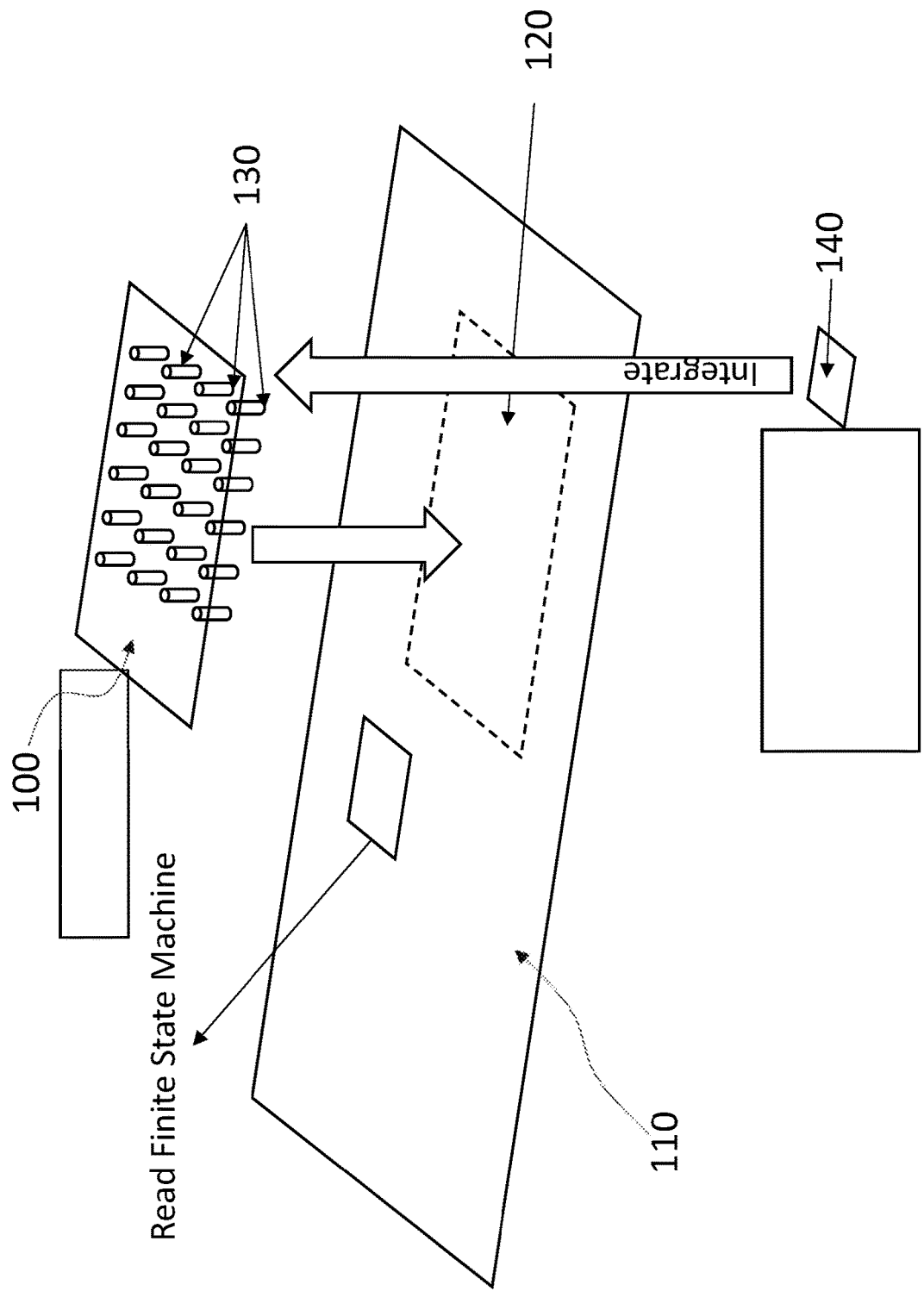
FIG. 1 is a schematic and perspective view of a System-on-Chip device according to the present disclosure and including a memory component replacing an embedded memory portion of the prior SoC devices.

As shown in FIG. 1, according to the present disclosure, the memory component 100 is structured as a stand-alone device realized in a single die with a technology specifically dedicated to the manufacturing of flash memory devices. The memory component 100 is an independent structure but it is strictly associated to the host device or to the SoC structure. More particularly, the memory device 100 is associated and linked to the SoC structure 110 partially overlapping such a structure while the corresponding semiconductor area of the SoC structure has been used for other logic circuits and for providing support for the partially overlapping structurally independent memory device 100 for instance through a plurality of pillars 130 or other similar alternative connections such as ball on grid or with a technology similar to Flip-Chip.

In order to mount the chip to external circuitry (e.g., a circuit board or another chip or wafer), the chip is flipped over so that its top side faces down, and aligned pads-topads so that its pads are aligned with matching pads on the external circuit. Then the solder is reflowed to complete the interconnections.

The final configuration will be a face-to-face interconnection SoC/Flash Array with the sense amplifiers will be connected to the SoC in a Direct Memory Access configuration.

At the end, the memory device is manufactured according to the user's needs in a range of values that may vary according to the available technology, for instance from at least 128 Mbit to 512 Mbit or even more without any limitation for the applicant's rights. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

In one embodiment of the present disclosure, the memory component 100 for the SoC structure 110 includes at least a memory portion and a logic circuit portion for interacting with the memory portion and with the SoC structure 110. A logic circuit 140 is integrated in the SoC structure 110 to cooperate with the logic circuit portion of the memory component 100.

More generally, the memory component 100 has a minor size if compared with the larger size of the SoC structure 110, the term "partially overlapping" meaning that the memory component 100 covers only partially or not completely the area of the SoC structure 110. However, even a memory component 100 of a larger size may be supported and interconnected with the pads of the SoC structure keeping the position and dislocation of the its interconnection or interconnecting pads.

In one embodiment of the present disclosure, the arrangement of the pads of the memory component 100 has been realized on a surface of the memory component 100. More specifically, the pads are arranged over the array so that, when the memory component 100 is reversed, its pads are faced to corresponding pads of the SoC structure 110. The semiconductor area 120 that in known System-on-Chip devices was occupied by the embedded non-volatile memory portion is dedicated to the housing of the interconnecting pads corresponding to the pads of the memory component 100.

As an alternative, if a face-to-face coupling is adopted, a stack of memory components of the same size could be overlapped realizing a stack structure, wherein each independent component is addressed by the logic circuitry of the SoC structure 110 though a corresponding identification address.

The semiconductor area 120 previously occupied in known solution by an embedded memory portion is now used to implement additional functionalities and to prepare the semiconductor device for a Logic Over Pads technology. The expression "Logic Over Pads" means providing logic circuitry overlapping some connection pads located internally to a first or base layer represented by a complete semiconductor product, i.e. the SoC structure 110. In the case of expanding the memory in the SoC, the technology will provide pads over memory either in the SoC silicon and in the Flash Array.

The memory component 100 thus represents an upper layer coupled and interconnected to the base SoC structure 110 but has a greater capacity and can cover a larger semiconductor area than the semiconductor area 120.

Moreover, for a better functioning of the SoC structure 110, even the logic circuit portion 140 of FIG. 1 (which in the known SoC device included a Modify Finite State Machine or a RISC controller) has been removed from the SoC and reorganized in association with the memory component 100. Therefore, for supporting the write and erase phases performed on the larger memory component 100, a Modify Finite State Machine or RISC 140 has migrated into the memory component 100.

The separation and optimization of the logic circuit portion further allows to enhance the functionality of the whole SoC structure 110, thus obtaining an independent semiconductor memory component 100 coupled to the SoC structure 110.

This independent semiconductor memory component 100 therefore includes at least the memory portion (preferably a non-volatile memory portion) and the associated modify finite state machine 140, both incorporated into a semiconductor product that is coupled to the SoC structure 110. In this case, the logic embedded in the SoC is the read logic: fetch of the data, correction of the data, elaboration and execution.

As will appear in the following of the present disclosure, a DMA capability is provided to the memory component 100 with an interface logic JTAG TAP using modified JTAG cells as well as a flexible TDI, secure access, address buffers and other features for handling the communication with the SoC structure 110.

Figure 2:
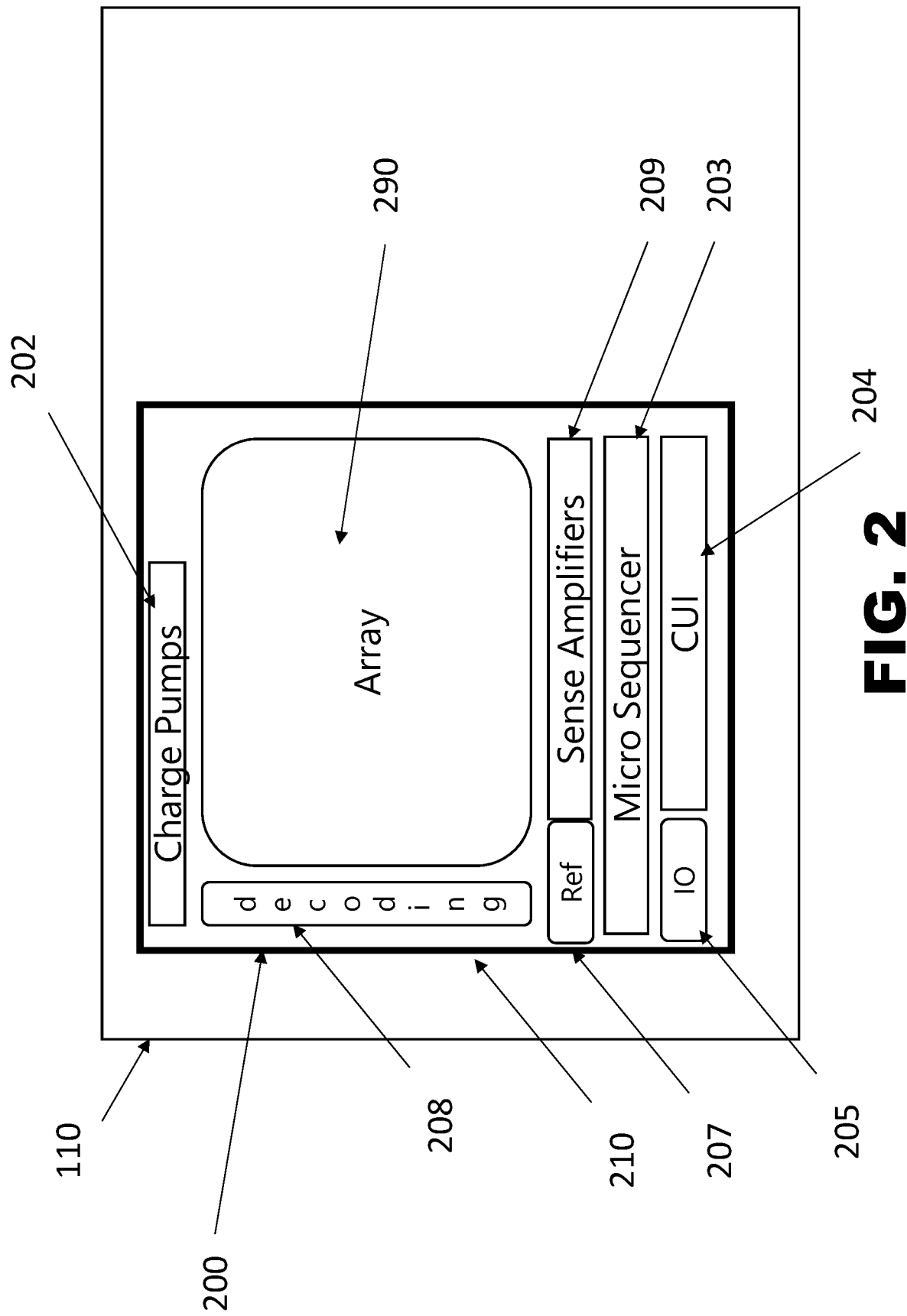
FIG. 2 is a schematic view of the memory component according to the present disclosure.

Now, with more specific reference to the example of FIG. 2, the main structure of the memory component 200 according to an embodiment of the present disclosure will be disclosed, wherein the reference 200 of FIG. 2 corresponds to the reference 100 of FIG. 1.

The memory component 200 includes at least: an I/O circuit 205, a micro-sequencer 203, an array of memory cells 290, voltage and/or current reference generators 210, a charge pump architecture 202, address decoders 208, sense amplifiers 209 and corresponding latches, a service logic to connect all the parts of the memory, and a command user interface 204, for instance a CUI block.

The array of memory cells 290 includes non-volatile Flash memory cells.

In one embodiment of the present disclosure, the memory component 200 implements a Direct Memory Access type of memory to replace the embedded memory array of known SoC devices.

Moreover, the proposed idea provides for the implementation of the memory component 200 in a "Known Good Die" (KGD) form factor or bare die, that allows connecting the sense amplifier outputs, except for a latch structure in the middle, directly with a controller of the SoC structure.

Strategies for obtaining the KGD form factor have been based on taking advantage of the existing infrastructure for test and burn-in of traditionally packaged components. This minimizes the amount of hardware, tooling, or insertions that add cost to the bare die products.

Figure 3:
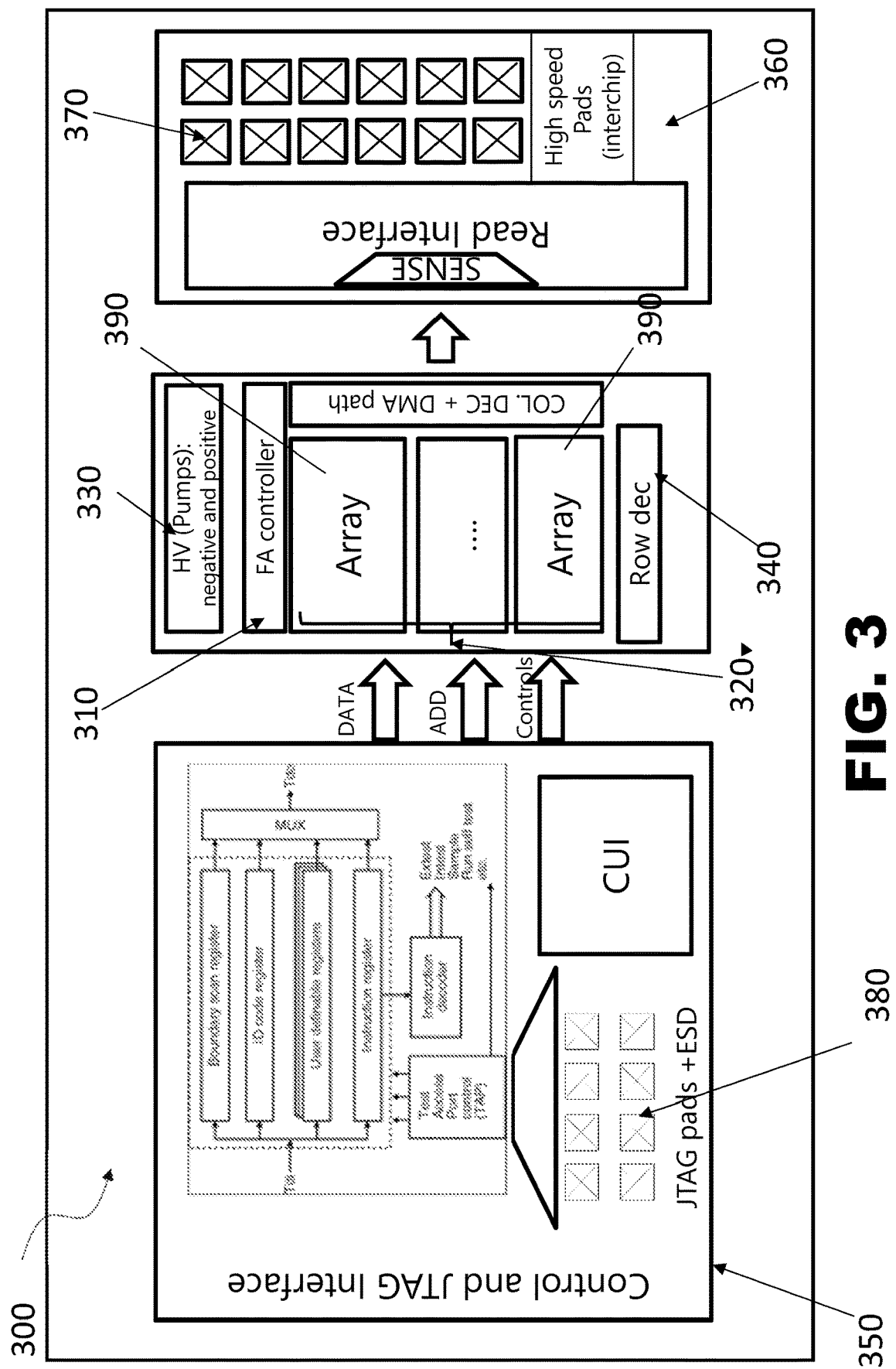
FIG. 3 shows a schematic view of a portion of the non-volatile memory component of FIG. 2 including a layout configuration according to the present disclosure.

FIG. 3 shows in more detailed the internal structure of the memory component 100 or 200. In such a FIG. 3, the memory device is indicated with the number 300 corresponding to the reference number 200 of FIG. 2 and the memory array 290 is indicated with the number 320.

A JTAG interface 350 is adopted for the test of the memory component 300, allowing the re-use of the testing tooling. Therefore, the memory component 300 also comprises a JTAG logic 350. This JTAG interface 350 will be disclosed later in more details with reference to FIG. 8.

In more details, the memory array includes at least a JTAG interface 350 receiving as inputs standard JTAG signals: TMS, TCK, TDI as well as data from a memory page. According to embodiments of the present disclosure, an extended TDI is used as flexible TDI. The flexibility is due to the fact that the number of parallel bits working as TDI are depending from the selected registers, i.e. K (four, in the example) lines for the instruction register, M lines for the address register, N lines for the data register, etc. while TDI comes from the JTAG protocol that uses TDI as name on the signal used to fill the registers.

This JTAG interface 350 produce as output data, addresses and control signals that are transferred to a memory address decoder 340 and also to the internal flash controller 310 to perform modify, testing, verification operations.

The activity of the decoder 340 is allowed by charge pumps 330 structured to keep secret the voltages and timings to manage the array. The decoding phase drives the data lines while the charge pumps provide the high voltage routed by the address decoder in the selected data lines.

This decoder 340 addresses the selected memory block. The address decoder is connected to the array to select the proper data lines, i.e. row and column for each super page. the read, modify and any other operations are using the address decoder to properly address bytes in the memory array.

The interconnections also include the JTAG interface 350 and control pins for testing and other purposes. The core of the SoC device 110 can have access to the JTAG interface 350 by using some internal pads 370. Such pads are high speed and have the capability to support the maximum frequency. More specifically, high speed pads 370 are used in the fast read path versus the SoC 110, while a low speed path 380 is dedicated to the testing phase. The JTAG cells are part of the fast path, but the JTAG interface is using the slower path.

According to the present disclosure, the memory component 1 is equipped with a controller 310 of the flash array 320 (hereinafter referred to as Flash array controller). The flash array controller 310 has an architecture that allows using some flash array resources with the SoC controller without compromising the secrecy of certain information stored therein (for example, algorithms, flash array voltages, currents, and more in general process information) and guarantees eventual customer return management. This is allowed by the adoption of a special structure wherein the user can write his own firmware in a first area and can interact with the controller internal firmware in a second different area.

Therefore, the memory component 100 and the host or SoC 110 have been coupled with an interface using a very high parallelism. This feature can be used also to improve the performance, for instance to load the Instruction Register and the (generic) Data Registers.

The need of having a very low initial latency and high throughput is driving the generation of the following scheme for the addressing per sub-array.

As will be later disclosed in more details, each memory block is connected to corresponding amplifiers and the sense amplifiers of the read interface 360 are connected to the SoC device 110 using modified JTAG cells. The communication channel between the flash array blocks and the SoC device 110 is represented by a control and status bus.

Figure 5:
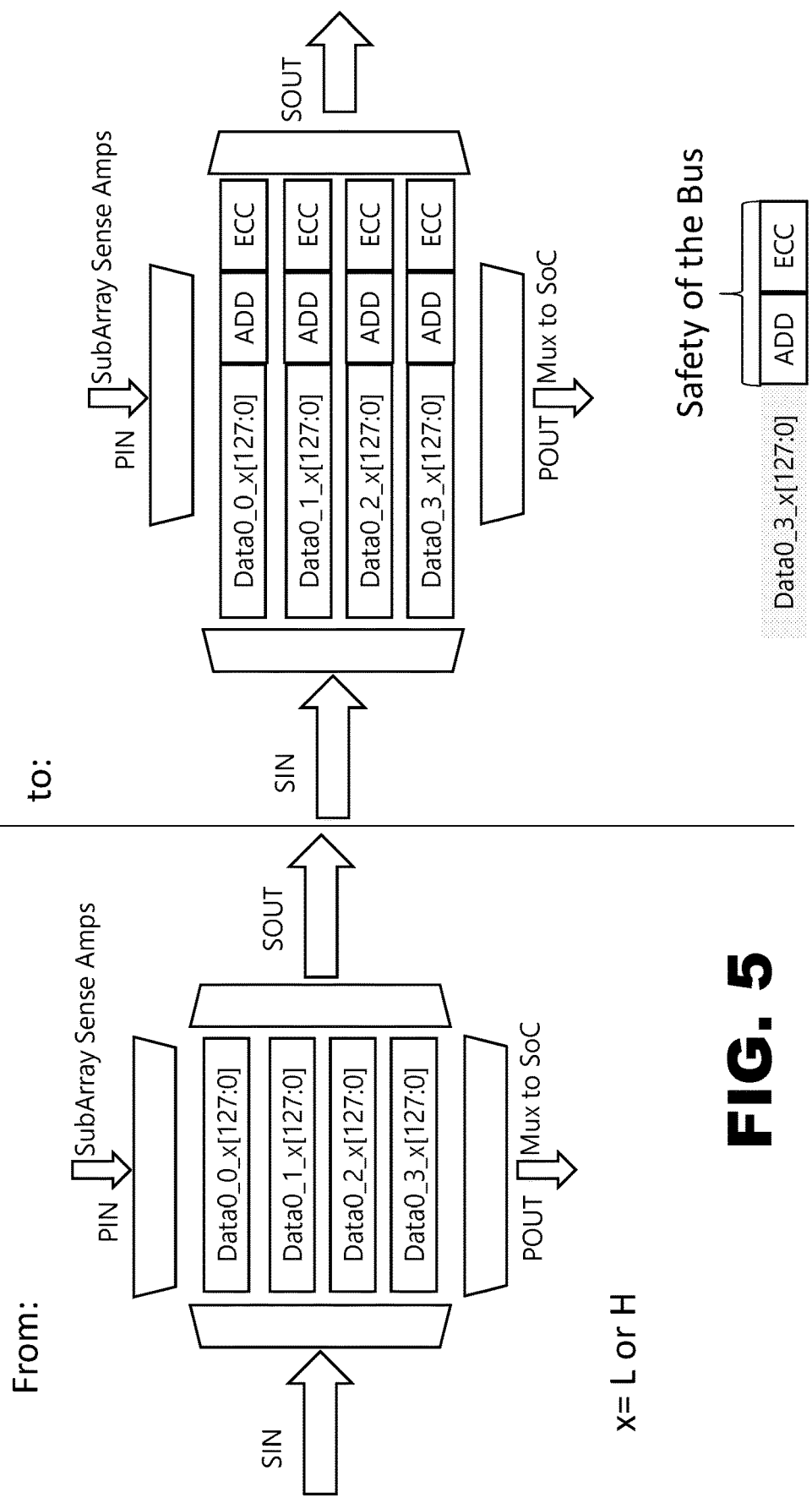
FIG. 5 is schematic view of an extended memory page in the memory rows of the memory block of FIG. 4.

The output of the read interface 360 is represented by an extended page including the combined string of data cells+address cells+ECC cells that will be disclosed later with reference to FIG. 5. The write operation also drives the three components (data cells+address cells+ECC cells) of the extended page; the ECC and the address cells serves as a safety mechanism to ensure the low probability to make mistakes.

The total amount of Bits would involve in the example disclosed herewith N+M+R Bits, for instance one-hundred-sixty-eight pads per channel in the implementation disclosed herewith.

The memory component 300 uses the interconnection pads and the logic circuit portion to allow the interconnection with the SoC structure 110.

The final configuration will be a face-to-face interconnection SoC/Flash Array, wherein the sense amplifiers of the memory component 300 will be connected to the SoC in a Direct Memory Access configuration. The interconnections also include the JTAG interface and control pins for testing and other purposes.

In this manner it is possible to keep relatively low the number of pads required for the interconnections.

According to the present disclosure, the memory component 300 is equipped with a controller 310 of the flash array 320 (hereinafter referred to as Flash array controller), said flash array controller 310 having an architecture that allows sharing some flash array resources with the SoC controller without compromising the secrecy of certain information stored therein (for example, algorithms, flash array voltages, currents, and more in general process information) and guarantees eventual customer return management.

The memory array 320 of the memory component 300 is built as a collection of subarrays 390. The scan chains can be connected to form a unique shift register to proper test the interconnections.

This architecture is that it is very scalable, wherein expanding and/or reducing the density of the final device translates only in mirroring a sub-array and providing the corresponding interconnections in a very scalable manner. The memory can be expanded also increasing the memory size per sub array, without enlarging the number of channels for the SoC.

The Direct Memory Access allows to reduce the final latency that the SoC can experience when reading the data.

Coming now to a closer look to the internal structure of the memory component 100 or 200 or 300 it should be noted that the architecture of the memory array 320 is built as a collection of sub arrays 390.

Each sub array 390 is independently addressable inside the memory device 300. Each sub-array 390 contains multiple memory blocks 460 (depicted in more detail in FIG. 4).

In this manner, having smaller sectors if compared to known solutions the access time is significantly reduced and the whole throughput of the memory component is improved. The reduction of the initial latency time is at block level because the row and column lines, the read path associated latency and the external communication have been optimized. The initial latency is the time needed to have the first valid data after the issuing of the address.

In the embodiments disclosed herewith the memory array 320 is structured with a number of sub-arrays 390 corresponding to the number of cores of the associated SoC 110 and, therefore to the number of corresponding communication channels. For instance, at least four memory sub arrays 390 one for each communication channel with a corresponding core of the SoC 110 are provided.

The host device or the System-on-Chip 110 normally includes more than one core and each core is coupled to a corresponding bus or channel for receiving and transferring data to the memory component 100, 200 or 300. We will make a generic reference to a number of K buses for N data Bits.

Therefore, in the present implementation each sub-array 390 has access to a corresponding channel to communicate with a corresponding core of the System-on-Chip 110. The outcome of the memory blocks is driven directly to the SoC without using high power output buffers and optimizing the path.

This architecture is very scalable, wherein expanding and/or reducing the density of the final device translates only in mirroring a sub-array and generating the connection or increasing the number of blocks of each subarray, that is the available density per core.

In embodiments of the present disclosure each independently addressable location of the blocks of each memory sub array 390 addresses an extended page 450 (depicted in more detail in FIG. 4) that will be also defined hereinafter with the term super page intending a double extended page.

As non-limiting example, this extended page 450 comprises a string including a first group of at least N Bits, for instance one-hundred-twenty-eight (128) Bit for the I/O data exchange with the SoC device 110 plus at least a second group of M Bits, for instance twenty-four (24) address Bit and a final or third group of at least R Bits, for instance sixteen (16) ECC Bit. The M address Bit (in the example the twenty-four address Bits) are sufficient to address up to 2GigaBit of available memory space.

Figure 4:
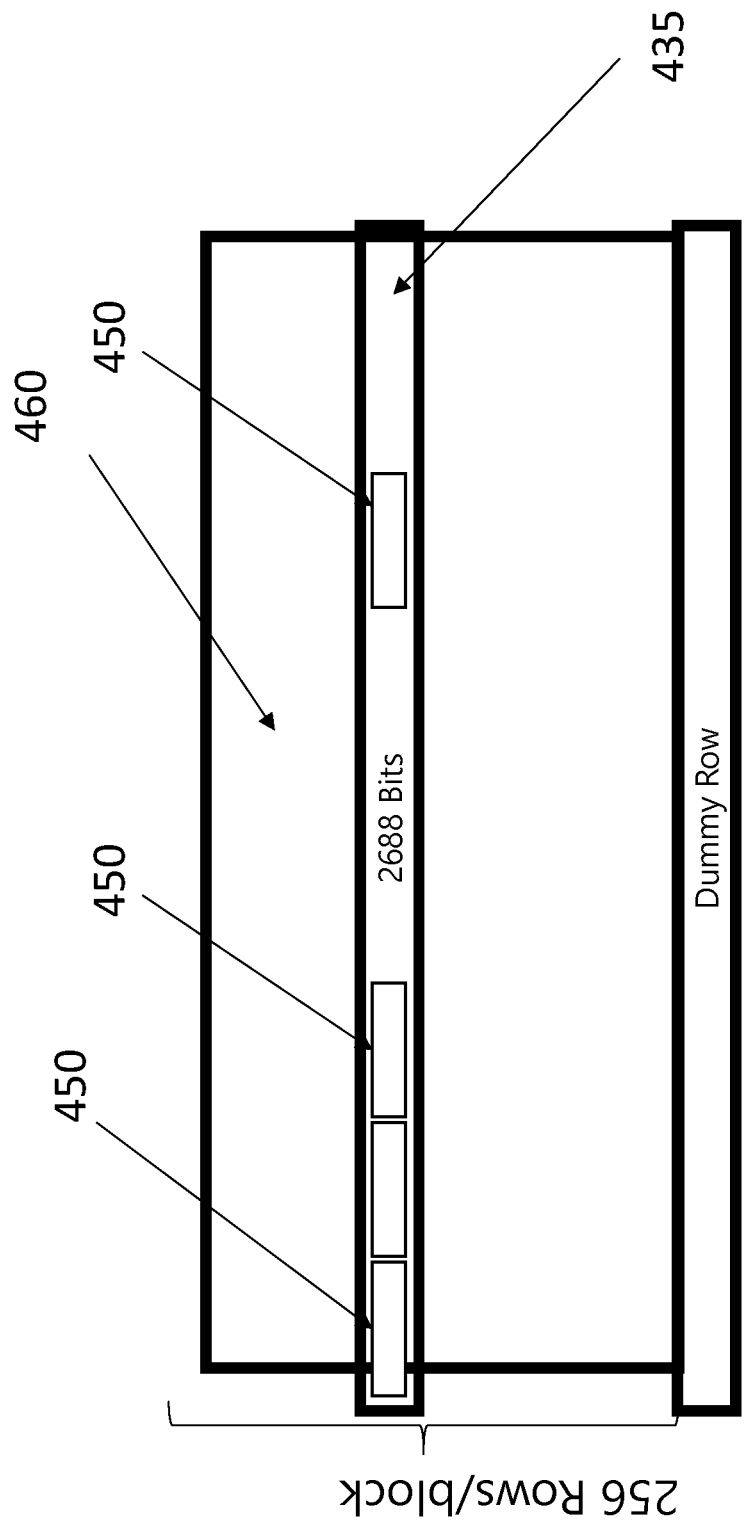
FIG. 4 is a schematic view of memory block formed by a plurality of rows of a memory array according to one embodiment of the present disclosure.

As shown in FIG. 4, each block 460 of each memory sub array 390 is structured with a row 435 containing at least 16 double words of N Bits (i.e. 128bits) each, plus the M address Bits and the R ECC syndrome spare Bits per page forming a memory page of N+M+R 168 Bits. This architecture is similar to a DRAM like scheme for preparing multiple addresses at the same time. For instance, each double words including N+M+R Bits may include 168 Bits plus 168 Bits to form the super page previously mentioned.

A skilled in this art may appreciate that a larger or a smaller memory device can be structured with an increased number of memory sub arrays 390 thus expanding or reducing the density of the final memory device 100. A larger memory device is obtained for instance by mirroring a sub array 390 and providing the corresponding interconnections in a very scalable manner.

The combined string of data cells+address cells+ECC cells forming the extended or super page 450, shown schematically in FIG. 4, allows implementing the safety coverage of the bus according to the standard requirements of the rule ISO26262, because the ECC covers the whole bus communication (data cells+address cells), while the presence of the address cells provides the confidence that the data is coming exactly from the addressed location of the controller, i.e. if ADD==ADD0.

The R ECC cells allows the host controller to understand if corruption is happening in the data plus address content.

The implementation of this mechanisms ensures the optimization of the read operation of the memory.

According to the present disclosure, the outputs of the sense amplifiers SA prepare a double extended page at a time, i.e. a super-page 450 comprising a number of Bits given by the double combination of the above-mentioned three groups of data bits, address bits and ECC bits, according to the size of the memory array.

In the specific but non-limiting example disclosed herewith each extended page 450 includes at least 168 Bit obtained by the combination of the above three groups of N+M+R=128+24+16 data, address and ECC Bit and each super-page is formed by a couple of extended pages, i.e. a group of 168×2 Bits.

Just to give a non-limiting numeric example, each row of a memory block 460 includes sixteen extended pages. Therefore, the resulting row includes 2688 Bit coming out from the combination of sixteen extended pages independently addressable and each including 168 Bit or, said differently, the combination of eight super-pages.

In embodiments of the present disclosure the output of a generic sub-array 390 is configured to combine the following sequence: N data cells plus M address cells plus R ECC cells. In this non-limiting example the total amount of Bits would involve 168 pads per channel, as shown in the example FIG. 5.

The combined string of data cells+address cells+ECC cells allows implementing the safety coverage of the bus according to the standard requirements, because the ECC covers the whole bus communication (data cells+address cells), while the presence of the address cells provide the confidence that the data is coming exactly from the addressed location of the controller.

Figure 6:
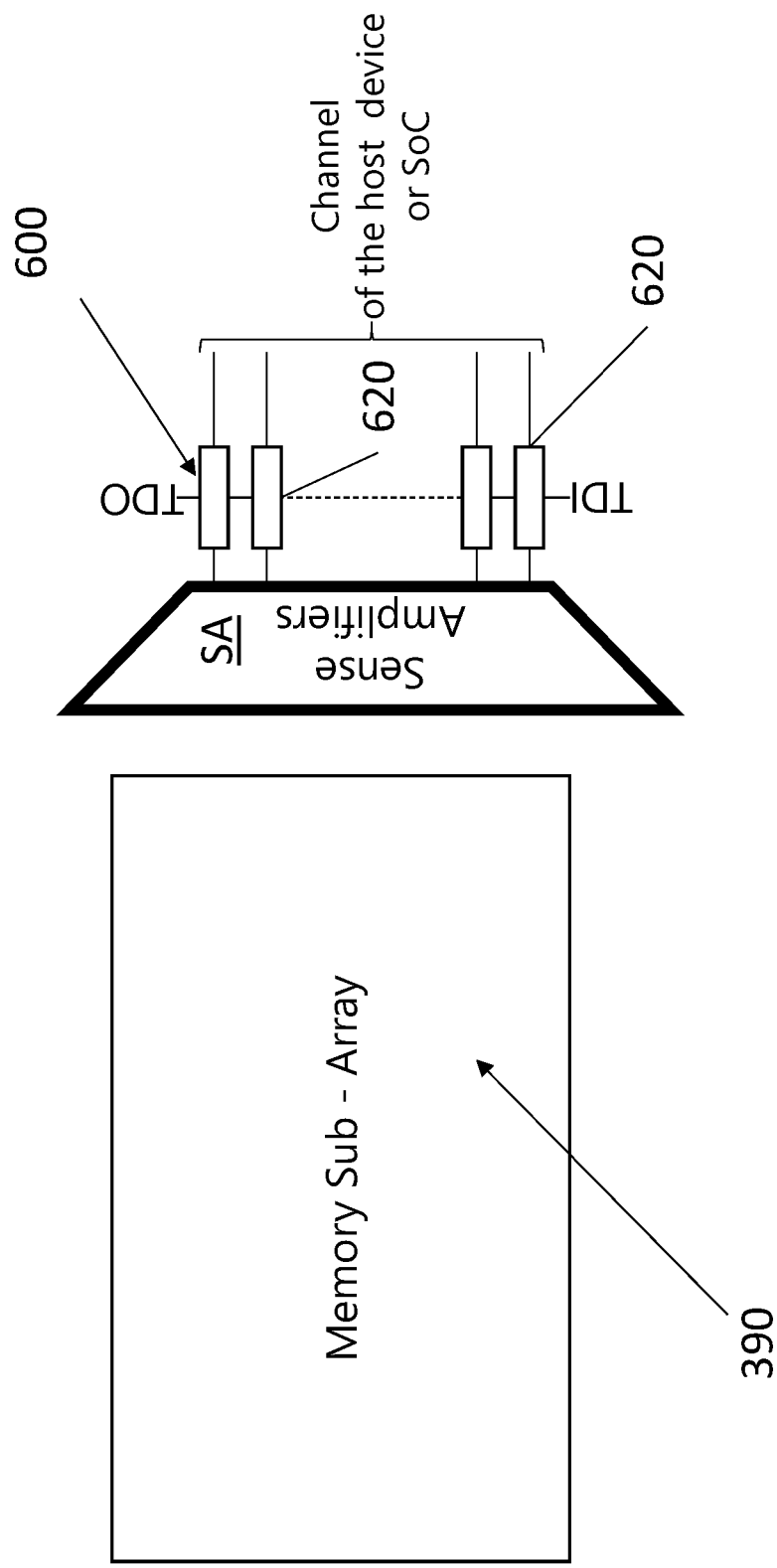
FIG. 6 is a schematic view of a particular of the memory portion shown in FIG. 3.
Figure 7:
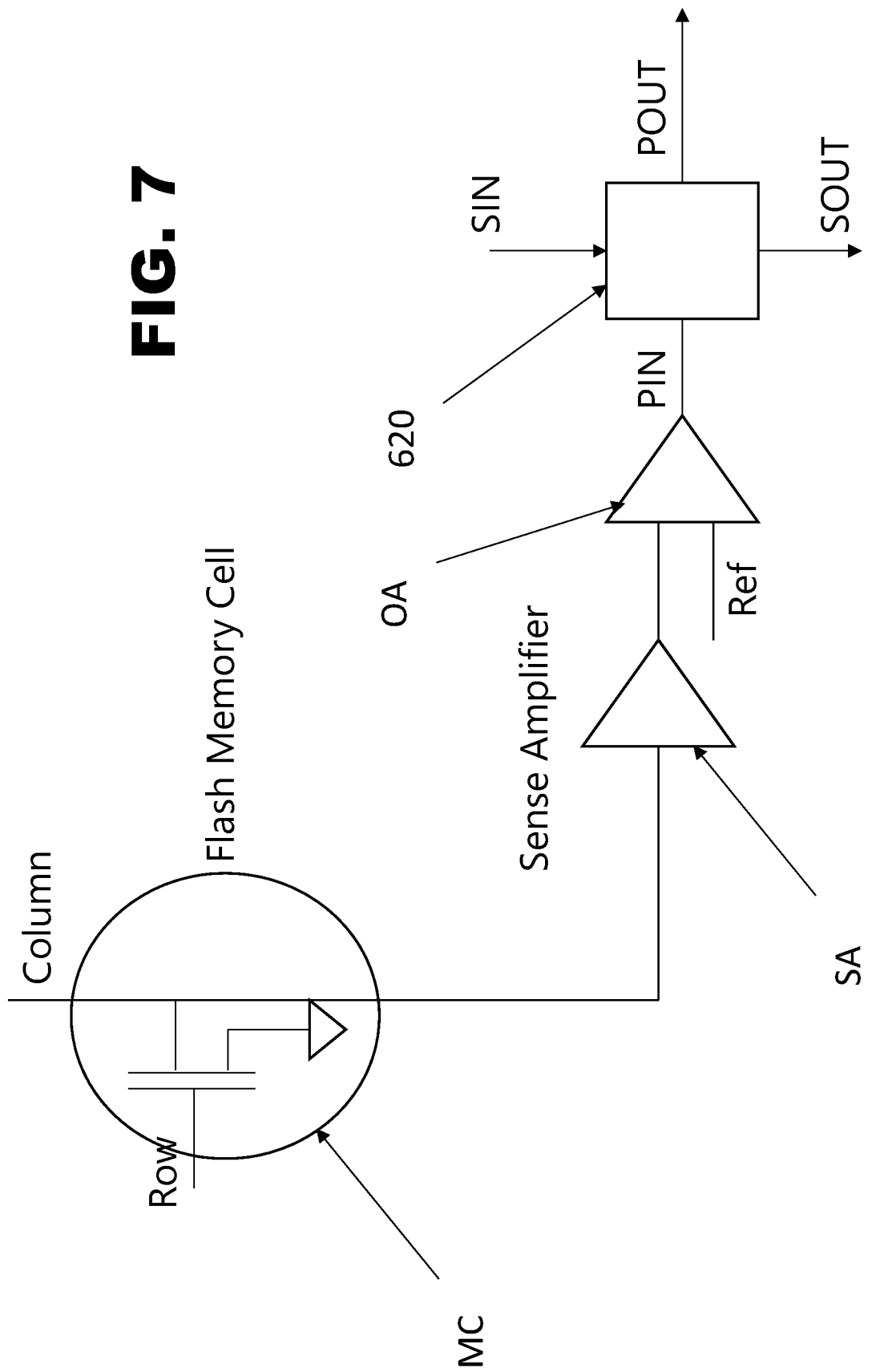
FIG. 7 is a schematic view of the connections between a generic memory cell and a corresponding sense amplifier with the inclusion of the modified JTAG cell according to the present disclosure.

The sense amplifiers SA of each sub array 390 are connected with a scan-chain of modified JTAG cells 700, connecting together all the output of one sub-array 390, as shown in FIGS. 6 and 7.

The present disclosure relates to a memory device with an improved sensing structure and including:
  a memory array comprising a plurality of sub-arrays of memory cells and structured in memory blocks;
  sense amplifiers coupled to the memory cells;
  modified JTAG cells coupled in parallel to the outputs of the sense amplifiers and serially interconnected in a scan-chain structure thus integrating a JTAG structure and the sense amplifiers.

The scan-chain structures associated to each sub array are interconnected to form a unique chain as a boundary scan register. Moreover, boundary scan register is a testing structure to test interconnections of the sense amplifiers.

FIG. 6 shows a schematic view of a memory portion wherein the subarray 390 architecture is structured to serve at least a channel of the SoC structure 110 to which the memory component 100, 200 or 300 is associated.

In this FIG. 7 it is shown an example wherein the modified JTAG cells 700 associated to a sub array 390 can be interconnected to form a unique scan-chain 1000 for quickly checking the integrity of the pad interconnections.

Thanks to the memory architecture of the present disclosure it is possible to pass from a parallel mode for retrieving data and addresses from the memory sub arrays 390 to a serial mode for checking the interconnections between the memory component 100 and the associated SoC device 110. Moreover, the SoC 110 is entitled to read once '1' and once '0' to perform tests and can also analyze the memory outcome, scanning out the data using the scan-chain.

It should be further noted that each subarray 390 includes address registers connected to data buffer registers, similarly to an architecture used in a DRAM memory device, i.e. DDRX type in 3DXP or as LPDDRx.

In the following paragraphs of the present disclosure it will be apparent that the outputs of the sense amplifiers SA per sub array 390 are latched by an internal circuit, so to allow to the sense amplifiers to execute a further internal read operation to prepare the second nibble or group of 168 Bits. This second nibble is transferred to the output of the flash array 320, using an additional enabling signal (i.e. an internal clock signal or an ADV signal; ADV=Address Data Valid. in our case the signal is load_data[1:0], depending on the addressed flip flop) that transfers the content read at sense amplifier level to the host device or SoC device 110.

In other words, the internal sense amplifiers prepare two extended pages 450 and while the first page is ready to be shifted (or also shifted out), internally it is performed a reading phase of the second page associated with the same address. This allows to prepare from five to eight double word (in the present example), that are typical in the RTOS application. In any case, the disclosed structure can be expanded to allow multi-page read while shifting out the already read page.

The sense amplifiers SA are connected directly to a modified JTAG cells 700, that will be later disclosed in greater details, so to integrate a JTAG structure and the sense amplifiers in a single circuit portion. This allows reducing as much as possible the delay in propagating the output of the memory array to the SoC 110.

Just to report a numeric example based on the embodiment disclosed herewith, we may remark that each address in the address buffers is linked to a data buffer, containing for instance N data Bits (i.e. 128 Bits). However, the SoC can need up to 2*N Bits (i.e. 256 Bits, without the address Bits and the ECC) at a time, so the data buffers will be duplicated so to be able to shift, assuming to use the address 0 of the sub array 0:

First pass of the first group of N Bits: Data 0_0_H [127:0]+ADD+ECC
Second pass of the second group of N Bits: Data 0_0_L [127:0]+ADD+ECC The above indications are for a are standard read used for instance for safety purpose and data integrity/correction.

In one embodiment the address buffers are realized making use of modified JTAG cells 620 as we will see hereinafter.

In one embodiment of the present disclosure each sub array 390 is independently addressable inside the memory device 100.

The JTAG Cell 620 is connected in the following manner shown in FIGS. 6 and 7:

PIN: output of a sense amplifier
POUT: to the SoC correspondent Data I/O
SIN: is the serial IN input connected to the SOUT of the previous sense amplifier
SOUT: is the serial output connected to the SIN of the next sense amplifiers A scan chain 600 made by the interconnected JTAG cells 620, using the serial input and output, has some advantages:
be able to test the successful interconnection between the SoC and the Direct Memory Access (DMA) Memory;
be able to implement digital test of the sense amplifiers, because the cell 620 can work as program load to store the data inside the array;
be able to work as second level of latches.

We will see later in the present disclosure that when the first group of data Bits (an extended page) are ready to be transferred to the parallel output POUT of the sense amplifier, there is an internal latch coupled to the sense amplifier that can trigger the read data of the subsequent section (a second extended page) of the remaining data Bits.

Still making reference to the examples of the FIGS. 6 and 7 we may consider the interconnections of each JTAG Cell 620: PIN is coupled to the output of a sense amplifier; POUT is coupled to the corresponding Data I/O of the host device 110 (i.e. the System-on-Chip); SIN is the serial IN input connected to the SOUT of the previous sense amplifier while SOUT is the serial output connected to the SIN of the next sense amplifier.

For instance, the schematic example of FIG. 7 shows a schematic and generic memory cell MC which is located at the intersection of a row of memory cells and a column of memory cells in a matrix of cells of a generic sub-array, so that the cell can be addressed accordingly. The real implementation can contain additional circuits from the cell to the output of the SA but they are not shown not being relevant for the purpose of the present disclosure.

A sense amplifier SA is coupled to the column of memory cells as part of the read circuitry that is used when a data is read from the memory array. Generally speaking a memory word including the above-mentioned extended page 450 is read at a time and in the present example we will make reference to a memory page including data+address+ECC Bits.

As is well known, the role of the sense amplifier SA is that of sensing the low power signals from the array row. The low voltage values representing the logic data Bit (1 or 0, depending on conventions) stored in the memory cell MC are amplified to a recognizable logic level so the data can be properly interpreted by logic circuit portions outside the memory.

In the example disclosed herewith the output of each sense amplifier SA is coupled to the modified JTAG cell 620 so to integrate a JTAG structure and the sense amplifier.

In the non-limiting example disclosed herewith an output amplifier OA is interposed between the sense amplifier SA and the JTAG cell 700.

Thanks to the memory architecture of the present disclosure it is possible to pass from a parallel mode for retrieving data and addresses from the memory sub arrays 390 to a serial mode for checking the interconnections between the memory component 210 and the associated host device. Moreover, the SoC is entitled read once '1' and once '0' to perform tests and can also analyze the memory outcome, scanning out the data using the scan-chain The transition from the parallel to the serial mode is managed by the JTAG interface 350. However, the implementation of these dual mode operations is allowed by the specific structure of a modified JTAG cell 620 disclosed hereinafter.

Figure 8:
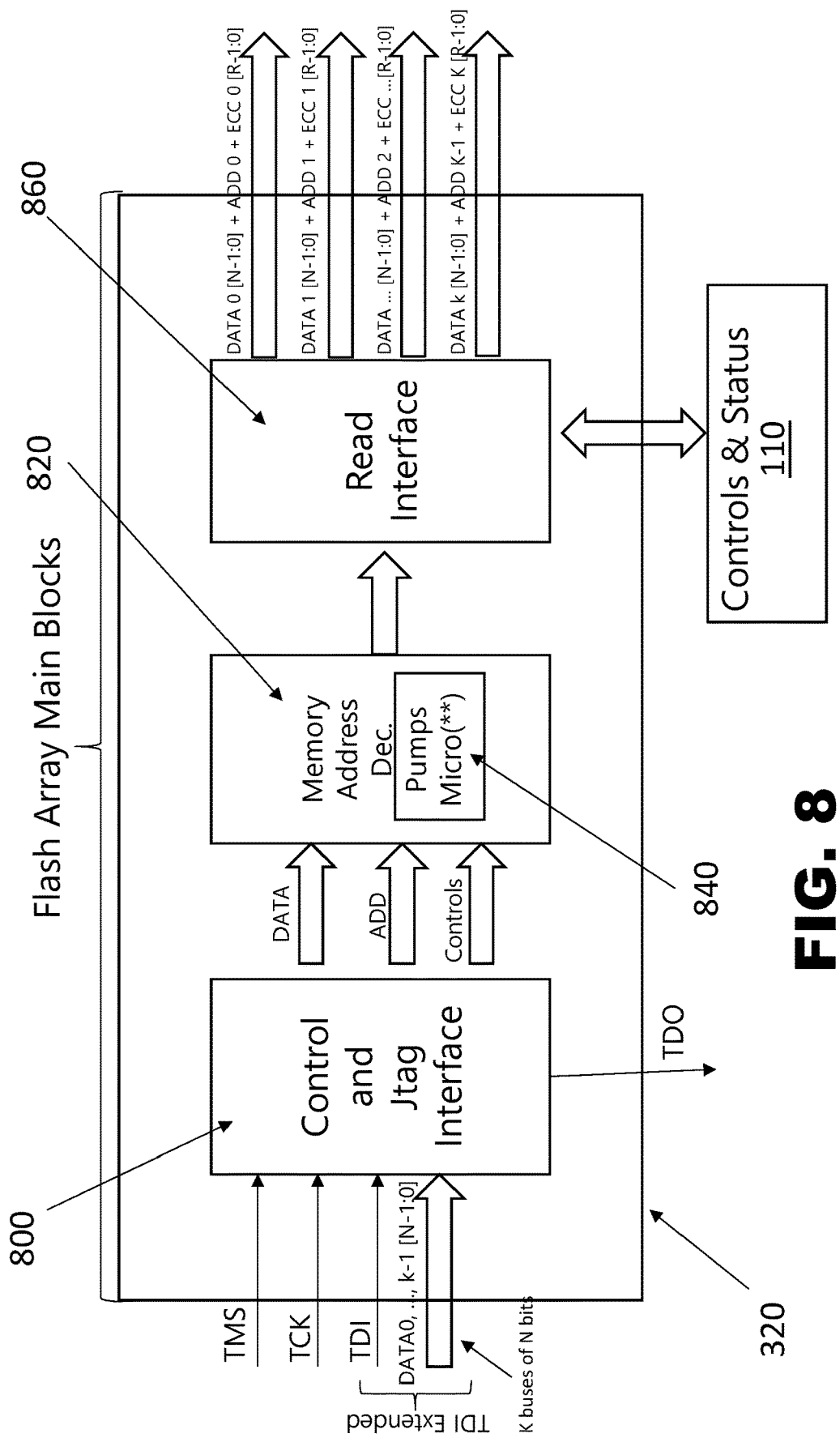
FIG. 8 schematically shows a more detailed internal structure of the memory component according to the present disclosure.

FIG. 8 shows a schematic view of the memory device 300 of FIG. 3 but illustrating in more details aspects of the data exchange. In more details, a JTAG interface 800 corresponding to the interface 350 of FIG. 3 is indicated as receiving inputs standard JTAG signals: TMS, TCK, TDI as well as data from a memory page of N Bits received on K buses. These data and the TDI signal may be considered a flexible TDI. The flexibility is due to the fact that the number of parallel bits working as TDI are depending from the selected registers, i.e. four lines for the instruction register, eight lines for the address register, 128 lines for the data register, etc. while TDI comes from the JTAG protocol that uses TDI as name on the signal used to fill the registers.

This control and JTAG interface 800 produces as output data, addresses and control signals that are transferred to a memory address decoder 820 and also to the internal flash controller to perform modify operations.

The activity of the decoder is allowed by charge pumps 840 structured to keep secret the voltages and timings to manage the array.

This decoder 820 is coupled to a read interface 860 that is in communication with the host or SoC device 110 through a control and status bus.

The output of the read interface 860 is represented by the extended page including the combined string of data cells+ address cells+ECC cells.

The total amount of Bits would involve in the example disclosed herewith one-hundred-sixty-eight pads per channel in the implementation disclosed herewith.

Figure 9:
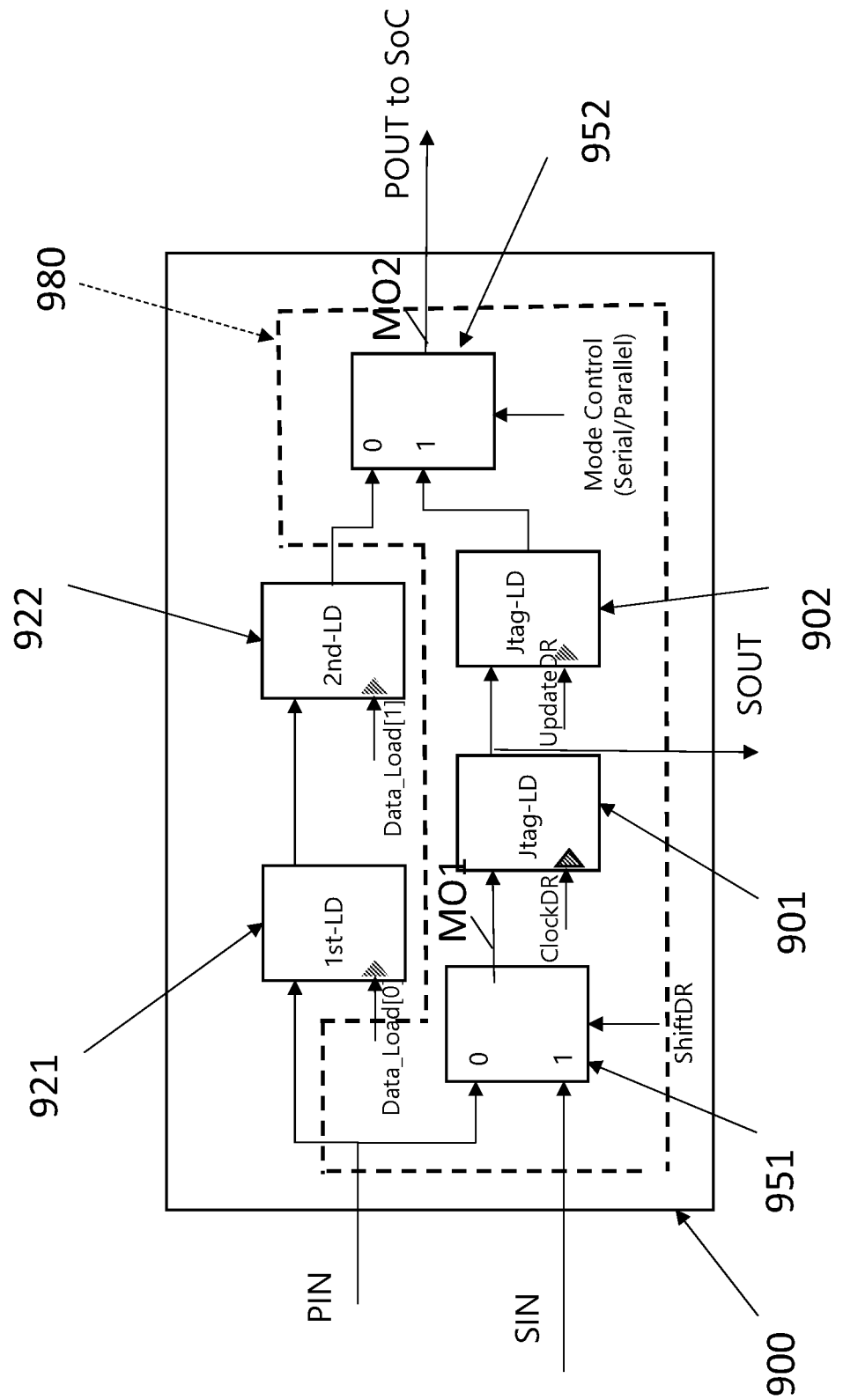
FIG. 9 is a schematic view of JTAG cell shown in FIGS. 6 and 7 and modified according to the present disclosure.

Making now more specific refence to the schematic example of FIG. 9 it is shown a JTAG cell 900 modified according to the present disclosure and corresponding to the modified JTAG cell 620 previously disclosed with reference to FIGS. 6 and 7.

The JTAG cell 900 has a first parallel input PIN terminal and a first serial input SIN terminal receiving corresponding signals Pin and Sin. Moreover, the JTAG cell 900 has a first parallel output terminal POUT and a first serial output terminal SOUT. The scan-chain 600 allows outputting the whole 168 Bits×2, because the first group is read directly from the output while the second group is prepared in the back.

Figure 10:
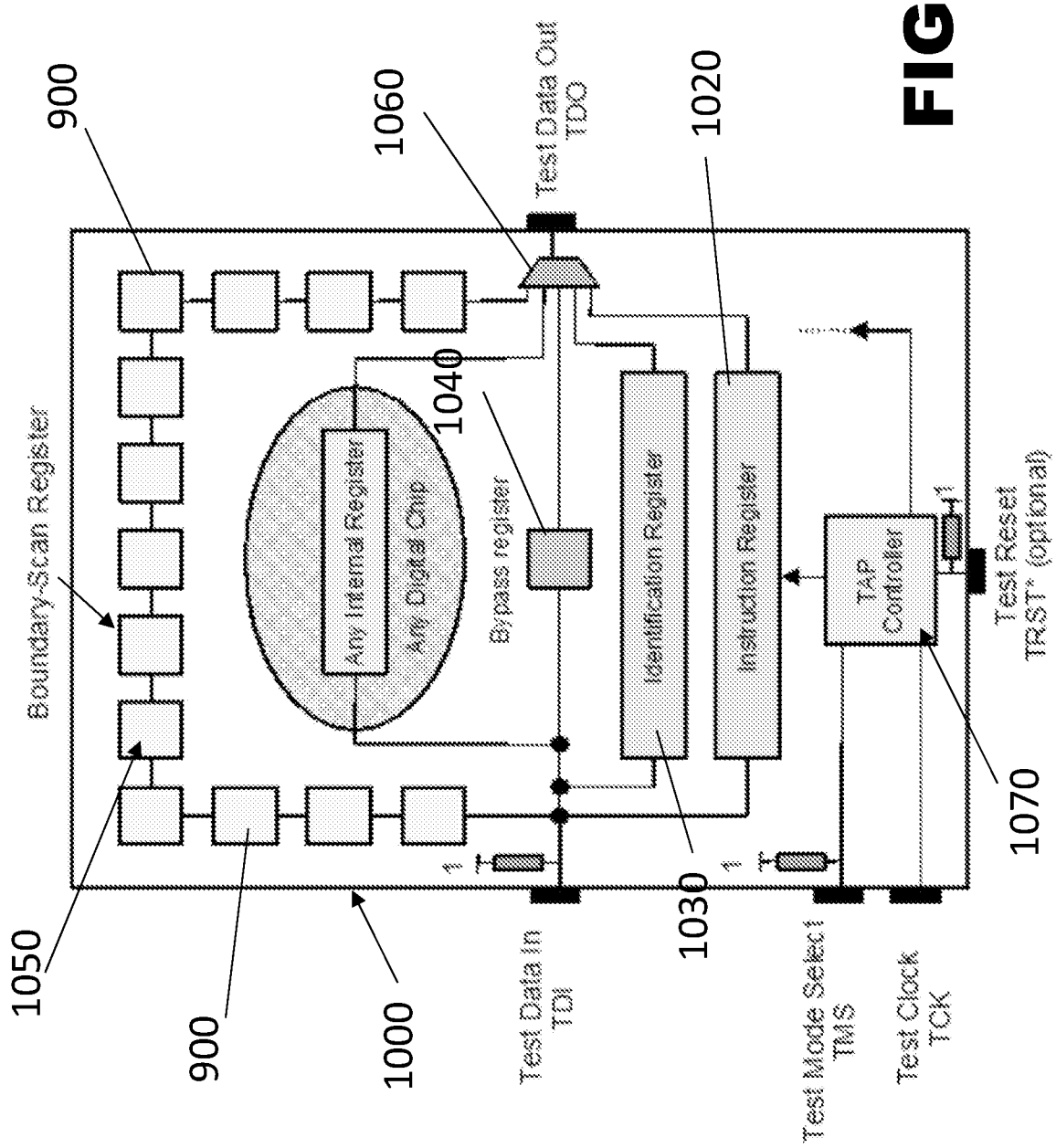
FIG. 10 shows a schematic view of a standard structure architecture using boundary-scan cell configured according to the IEEE standard No. 1149.1 but including the modified JTAG cells of FIG. 9.

As shown in FIG. 10 the JTAG cell 900 may be considered a box with two input terminals PIN and SIN and two output terminals POUT and SOUT. The input terminal PIN is a parallel input while the input terminal SIN is a serial input. Similarly, the output terminal POUT is a parallel output while the output terminal SOUT is a serial output.

Thanks to the serial input and output a testing process may be performed to check that no fault connection is present between the memory component 100 and the associated System-on-chip 110. Thanks to the parallel input and output the same JTAG cell is used as data buffer for the completing the reading phase through the sense amplifiers SA.

The JTAG cell 900 comprises a boundary scan basic cell 980 including a couple of latches 901 and 902 and a couple of multiplexer 951 and 952. A first input multiplexer 951 and a second output multiplexer 952.

The boundary scan basic cell 980 is indicated by the dotted line box in Figure and is a two inputs cell, with a serial input corresponding to SIN and parallel input corresponding to PIN, and two outputs cell with a serial output corresponding to SOUT and a parallel output corresponding to POUT.

The first multiplexer 951 receives on a first input "0" a parallel input signal Pin from the first parallel input terminal PIN and on a second input "1" a serial input signal Sin from the first serial input terminal SIN.

This first multiplexer 951 is driven by a control signal ShiftIR (referred to the instruction register signal) and has an output MO1. The cell 900 has two parallel outputs, i.e. MO1 and MO2. When the JTAG clock arrives, the serial output is driven out from the SOUT. SOUT is connected to the JTAG latch close to the multiplexer that receives a selector signal: Mode Controller (serial/parallel). Basically, the output of the latch connected to the input '1' of this multiplexer MO2 is also the SOUT.

The first multiplexer output MO1 is connected to a first input of the first latch 901 that receives on a second input terminal a clock signal ClockDR.

The first latch 901 is connected in chain to the second latch 902 with a first output of the first latch 901 connected to a first input of the second latch 902.

It is important to note that the output of the first latch 901 is also the serial output SOUT of the whole JTAG cell 900.

A second input terminal of the second latch 902 received a signal UpdateDR.

The second latch 902 has an output connected to an input of the second multiplexer 952, in particular to its second input.

This second multiplexer 952 is controlled by a Mode Control signal that allows to switch the whole JTAG cell 900 from a serial to a parallel mode and viceversa.

In one embodiment of the present disclosure the JTAG cell 900 further includes another couple of latches 921 and 922 provided between the parallel input Pin and the second multiplexer 952. These extra latches 921 and 922 are the latching of the direct read, i.e. first group of data Bits, and the shadow one, i.e. second group of 128 data Bits (without considering the address Bits and the ECC, i.e. in total 168 Bits). In other words, the JTAG cell 900 includes the boundary scan cell 980 and at least the further latches 921 and 922.

We will refer hereinafter to these further latches as a third latch 921 and a fourth latch 922. In other embodiments a longer chain of latches may be used.

More particularly, the third latch 921 and the fourth latch 922 are connected in a small pipeline configuration with the third latch 921 receiving on a first input the parallel input signal Pin from the first parallel input terminal PIN and receiving on a second input a signal Data_Load[0] corresponding to the AVD signal previously mentioned and to a first data load.

The fourth latch 922 receives on a first input the output of the third latch 921 and receives on a second input a signal Data_Load[1] (always the AVD signal) corresponding to a subsequent data load.

The output of the fourth latch 922 is connected to the first input "0" of the second multiplexer 952 that produces on its output terminal MO2 the output signal for the parallel output terminal POUT.

If compared to a conventional JTAG cell the JTAG cell 900 of the present disclosure may be considered a modified JTAG cell because of the presence of the two extra latches, the third and fourth latches 921 and 922, beside the presence of the boundary scan cell 980.

Now, we have to imagine that a JTAG cell 900 is coupled to the output of each sense amplifier SA of the memory sub-array 390. As usual, the memory array provides for a sense amplifier for each column of memory cells, as shown in FIG. 7.

In the embodiment of the present disclosure all the JTAG cells 900 coupled to the sense amplifiers of a memory sub-array are to be considered a data buffer including a data page, including in this example at least one-hundred-and-twenty-eight (128) Bits (always without the address Bits and the ECC Bits) for the reading of a combined memory page at a time from the four sub arrays 390.

However, as previously reported, the communication channel between the memory component and the SoC structure may need up to 256 Bits at a time (i.e. two combined extended memory pages=a super page) but in the present disclosure other 2×16 plus 2×24 further Bits are needed. The JTAG cell 900 has been modified just to duplicate the internal latches to be able to shift the first or higher portion of the 168 Bits of the data to be read with the second or lower portion of the data to be read. Obviously, in this contest "higher" means the data portion that is loaded before while "lower" means the data portion that is loaded after.

A skilled in this art will understand that the number of internal latches of the modified JTAG cell 900 can be augmented in case of need to improve the number of Bits to be transferred to the SoC structure through the communication channel. For example, the above structure may be expanded accordingly to the size of the page required by the particular implementation of the memory controller.

Just to explain the manner in which data are transferred in the data buffer we have to imagine that when a data is loaded in the one of the two latches 921 or 922, the other latch is in a stand-by state but ready to receive the subsequent data portion.

Therefore, the first section including 168 Bit (including the address Bits and the ECC Bits) is transferred to the SoC structure for a first data elaboration while the reading phase is not stopped since the other portion of 168 Bits are prepared to be loaded into the latches at the subsequent clock signal.

In this example, each data buffers contains 168 modified JTAG cells 900 and the common Data_Load[1:0] are signals generated to allow to capture the whole 168 Bits×2, that is to say: eight double words DWs according to the proposed implementation (four sub arrays for each double word).

The signal generation is internally controlled when the read operation is performed in a specific data buffer and the signals are controlled by the SoC structure to allow performing read phase using a 168 Bits parallelism.

The main benefit of this memory architecture is that each buffer can contain the whole double words DWs thus leaving free the sense amplifier to read in another memory location.

The presence of the modified JTAG cell 900 is particular important as output of the sense amplifiers since allows:
a. Using the boundary scan as method to check the interconnection between the SoC 110 and the Flash Array component 100, 200 or 300;
b. Implement the Direct Memory Access connecting directly the sense amplifier with the controller;
c. It allows to leave the sense amplifier to prepare the second 128 Bit wide page plus the address plus the ECC and written close to the page.

According to some embodiments, it is possible to adopt a boundary-scan test architecture including modified JTAG cells 900 thus obtaining a new and peculiar boundary-scan test architecture like the one shown in the schematic view of FIG. 10. Therefore, for this test only one output driven is needed and this is obtained using the signal TCK and the data stored in the cells. The scan chain test requires the SoC 110 to test the output of the scan chain.

As it is known in this specific technical field, boundary scan is a family of test methodologies aiming at resolving many test problems: from chip level to system level, from logic cores to interconnects between cores, and from digital circuits to analog or mixed-mode circuits.

The boundary-scan test architecture 1000 provides a means to test interconnections between the integrated circuits 100 and 110 on a board without using physical test probes. It adds a boundary-scan cell 900, like the one shown in FIG. 10, including a multiplexer and latches and associated to each pin or pad on the device.

In other words, each primary input signal and primary output signal of a complex semiconductor device like the memory component 100 or the host device 110 is supplemented with a multi-purpose memory element called a boundary-scan cell that, altogether, form a serial shift register 1050 around the boundary of the device.

Originally, those boundary-scan cells have been introduced as a means of applying tests to individual semiconductor devices. The use of boundary-scan cells to test the presence, orientation, and bonding of devices in place on a circuit board was the original motivation for inclusion in a semiconductor device.

According to the present disclosure the boundary-scan cells 900 are also used to test the interconnections between integrated circuits that work together such as the System-on-Chip 110 with the associated memory component 100, 200 or 300, as is the case of the present disclosure.

The collection of boundary-scan cells is configured into a parallel-in or parallel-out shift register and the boundary-scan path is independent of the function of the hosting device. The required digital logic is contained inside the boundary-scan register. Obviously, an external JTAG FSM interacts with the cells, i.e. shiftDR, shiftIR, UpdateDR, etc. are driven by the JTAG logic 350.

To summarize very briefly the functioning of a boundary-scan cell it may be said that each cell 900 is structured for capturing data on its parallel input PI; updating data onto its parallel output PO; serially scanning data from its serial output SO to its neighbor's serial input SI. Moreover, each cell behaves transparently, in the sense that PI passes to PO.

FIG. 10 shows a schematic view of a standard structure architecture using boundary-scan cells configured according to the IEEE standard No. 1149.1. However, according to the present disclosure, the boundary-scan cells used in the architecture 1000 are the modified JTAG cells 900 previously disclosed with reference to FIG. 9.

A JTAG interface is a special interface added to a chip. According to present embodiments, two, four, or five pins are added allowing to expand the JTAG according to the need of the present implementation.

The connector pins are: TDI (Test Data In); TDO (Test Data Out); TCK (Test Clock); TMS (Test Mode Select) and an optional TRST (Test Reset).

The TRST pin is an optional active-low reset to the test logic, usually asynchronous, but sometimes synchronous, depending on the chip. If the pin is not available, the test logic can be reset by switching to the reset state synchronously, using TCK and TMS. Note that resetting test logic doesn't necessarily imply resetting anything else. There are generally some processor-specific JTAG operations which can reset all or part of the chip being debugged.

Since only one data line is available, the protocol is serial. The clock input is at the TCK pin. One bit of data is transferred in from TDI, and out to TDO at each TCK rising clock edge. Different instructions can be loaded. Instructions for typical ICs might read the chip ID, sample input pins, drive (or float) output pins, manipulate chip functions, or bypass (pipe TDI to TDO to logically shorten chains of multiple chips).

As with any clocked signal, data presented to TDI must be valid for some chip-specific Setup time before and Hold time after the relevant (here, rising) clock edge. TDO data is valid for some chip-specific time after the falling edge of TCK.

FIG. 8 shows a set of four dedicated test pins—Test Data In (TDI), Test Mode Select (TMS), Test Clock (TCK), Test Data Out (TDO)—and one optional test pin Test Reset (TRST).

These pins are collectively referred as a Test Access Port (TAP). However, the architecture 1000 includes a finite-state machine, named TAP controller 1070, with receives as inputs three signals: TCK, TMS, and TRST. The TAP controller 1070 is a 16-state final state machine FSM that controls each step of the operations of boundary scan architecture 1000. Each instruction to be carried out by the boundary scan architecture 1000 is stored in the Instruction Register 1020.

FIG. 10 shows a plurality of boundary-scan cells 900 on the device primary input and primary output pins. The cells 900 are connected internally to form a serial boundary-scan register 1050. In other words, the modified JTAG cells 900 are used as building blocks of the boundary scan architecture 1000.

Data can also be shifted around the boundary-scan shift register 1050 in serial mode, starting from a dedicated device input pin called "Test Data In" (TDI) and terminating at a dedicated device output pin called "Test Data Out" (TDO) at the output of a multiplexer 1060.

The test clock, TCK, is TCK is selectively sent to each register depending on the TAP state and to the register selection; the fed of the TCK signal is performed via a dedicated device input pin and the mode of operation is controlled by a dedicated "Test Mode Select" (TMS) serial control signal.

The Instruction Register (IR) 1020 includes n-bit (with n≥2) and is implemented for holding each current instruction but can be expanded to handle the flexible TDI.

In line with the IEEE 1149 standard the architecture is completed by a 1-bit bypass register 1040 (Bypass); an optional 32-bit Identification Register 1030 (Ident), capable of being loaded with a permanent device identification code.

At any time, only one register can be connected from TDI to TDO (e.g., IR, Bypass, Boundary-scan, Ident, or even some appropriate register internal to the core logic). The selected register is identified by the decoded output of the IR. Certain instructions are mandatory, such as Extest (boundary-scan register selected), whereas others are optional, such as the Idcode instruction (Ident register selected).

A parallel load operation is called a "capture" operation and the data are captured in the selected register cells by the instruction. The capture causes signal values on device input pins to be loaded into input cells and signal values passing from the core logic to device output pins to be loaded into output cells.

A parallel unload operation is called an "update" operation to freeze the register content. Basically, it latches the content in the executable shadow register, inside the BS cell. This update allows to make available the shift register for future data/instruction coming in. Moreover, a PAUSE instruction permits to hold the data in the register even if it is not completed.

Depending on the nature of the input scan cells, signal values already present in the input scan cells will be passed into the core logic.

Now, in one embodiment of the present disclosure the boundary-scan architecture 1000 is completed with a further or more than one additional register 1080 that is specifically provided to manage the memory component 100. This additional register 1080 is also definable by the user. This expansion is allowed by the IEEE 1532 standard.

The composition of the registers incorporated into the boundary-scan architecture 1000 of the present disclosure is omitted to limit the present disclosure with undue information.

As previously disclosed, and to summarize the principle of the present disclosure, in some embodiments of the present disclosure the output of a generic sub-array 390 is formed combining the following sequence: data cells plus address cells plus ECC cells. In this non-limiting example the total amount of Bits would involve 168 pads per channel, as shown for instance in FIG. 5.

The combined string of data cells+address cells+ECC cells allows implementing the safety coverage of the bus according to the standard requirements, because the ECC covers the whole bus communication (data cells+address cells), while the presence of the address cells provide the confidence that the data is coming exactly from the addressed location of the controller.

The sense amplifiers SA of each sub array 390 are connected with the scan-chain of the modified JTAG cells 900, connecting together all the output of one sub-array 390. Moreover, the modified JTAG cells 900 associated to a sub array 390 can be interconnected to form a unique chain for quickly checking the integrity of the pads interconnections.

Thanks to the memory architecture of the present disclosure it is possible to pass from a parallel mode for retrieving data and addresses from the memory sub arrays 390 to a serial mode for checking the interconnections between the memory component 1 and the associated SoC device 110. Moreover, the SoC is entitled to read once '1' and once '0' to perform tests and can also analyze the memory outcome, scanning out the data using the scan-chain.

The error correction is left, as operation, to the SoC 110; the additional bits are provided to the controller to store any possible ECC syndrome associated with the page. The ECC cells allows the SoC controller to understand if corruption is happening in the data plus address content.

To write and erase the memory cells of the Array 320 it is provided a dedicated logic circuit portion including a simplified Reduced Instruction Set Computer (RISC) controller or a Modify Finite State Machine or that is the logic circuit for handling the programming and erasing algorithms.

Moreover, a JTAG interface 350 is adopted as regular user interface to modify the array and provide the read addresses to the memory blocks. The JTAG interface 350 is used also for the test of the memory component 100, allowing the re-use of the testing tooling. Therefore, the memory component 100 (or 200 or 300) also comprises a JTAG logic.

The Direct Memory Access allows to reduce the final latency that the SoC can experience when reading the data. Moreover, the final latency is also reduced by the block form factor, the sense amplifiers distribution between blocks, the selection of the comparison threshold in the sense amplifiers and the optimized path.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:
1. A memory device, comprising:
    a memory array including a plurality of sub-arrays of memory cells and structured in memory blocks, wherein:
        each sub-array corresponds to a different core of a System-on-a Chip (SoC) structure;
        each core is coupled to a different corresponding channel for receiving data at the memory device and transferring the data from the memory device;
        the memory device includes sense amplifiers coupled to the memory cells;
        the memory device includes modified JTAG cells coupled in parallel to outputs of the sense amplifiers and serially interconnected in a scan-chain structure that integrates a JTAG structure and the sense amplifiers with independent serial and parallel outputs; and scan-chain structures associated to each sub-array are interconnected to form a unique chain as a boundary scan register.

2. The memory device of claim 1, wherein the boundary scan register includes a testing structure to test interconnections of the sense amplifiers.

3. The memory device of claim 1, wherein the modified JTAG cells include serial and parallel inputs and outputs.

4. The memory device of claim 3, wherein the modified JTAG cells include latches inserted between the parallel inputs and outputs to load a memory page before reading a subsequent memory page from a sub-array.

5. The memory device of claim 1, wherein an output of a generic sub-array is configured to combine N data cells, M address cells, and R ECC cells.

6. The memory device of claim 5, wherein N+M+R is 168 or greater.

7. A memory device, comprising:
a memory array; and
a JTAG logic interface portion configured to interact with a System-on-Chip (SoC) structure through a communication channel and including the memory array that includes a plurality of sub-arrays of memory cells and is structured in memory blocks, wherein:
    each sub-array corresponds to a different core of the SoC structure;
    each core is coupled to a different corresponding communication channel for receiving data at the memory device and transferring the data from the memory device;
    the memory device includes sense amplifiers coupled to the memory cells;
    the memory device includes modified JTAG cells coupled in parallel to outputs of the sense amplifiers and serially interconnected in a scan-chain structure that integrates a JTAG structure and the sense amplifiers with independent serial and parallel outputs; and
    scan-chain structures associated to each sub-array are interconnected to form a unique chain as a boundary scan register.

8. The memory device of claim 7, wherein the sense amplifiers are coupled to the memory cells and to the communication channel.

9. The memory device of claim 7, wherein the scan-chain structure includes a data buffer configured to include a memory data page at a time while a different data page is read from the memory array.

10. The memory device of claim 9, wherein the memory data page includes data cells, address cells, and ECC cells.

11. An integrated semiconductor device, comprising:
a System-on-Chip (SoC) structure including interconnection pads; and
a memory device including the interconnection pads, wherein the memory device is coupled in a face-to-face manner to the SoC structure via the interconnection pads, and wherein the memory device includes:
    a memory array including a plurality of sub-arrays of memory cells and structured in memory blocks, wherein:
        each sub-array corresponds to a different core of the SoC structure;
        each core is coupled to a different corresponding communication channel for receiving data at the memory device and transferring the data from the memory device;
        the memory device includes sense amplifiers coupled to the memory cells;
        the memory device includes modified JTAG cells coupled in parallel to outputs of the sense amplifiers and serially interconnected in a scan-chain structure that integrates a JTAG structure and the sense amplifiers with independent serial and parallel outputs; and
        scan-chain structures associated to each sub-array are interconnected to form a unique chain as a boundary scan register.

12. The integrated semiconductor device of claim 11, wherein the boundary scan register is a testing structure to test interconnections of the sense amplifiers of the memory device.

13. The integrated semiconductor device of claim 11, wherein the modified JTAG cells include parallel inputs, the parallel outputs, and latches inserted between the parallel inputs and outputs.

14. The integrated semiconductor device of claim 11, wherein the interconnection pads include high speed pads and low speed pads.

15. The integrated semiconductor device of claim 14, wherein a JTAG interface is coupled to the SoC structure using the high speed pads.

* * * * *